United States Patent
Seo et al.

(10) Patent No.: US 10,288,966 B2
(45) Date of Patent: May 14, 2019

(54) THIN FILM TRANSISTOR SUBSTRATE AND MANUFACTURING METHOD THEREOF

(71) Applicant: Samsung Display Co., Ltd., Yongin-si (KR)

(72) Inventors: O Sung Seo, Seoul (KR); Tae Kyung Yim, Seoul (KR); Hyun-Ho Kang, Ansan-si (KR); Hyung June Kim, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/471,969

(22) Filed: Mar. 28, 2017

(65) Prior Publication Data

US 2017/0205651 A1   Jul. 20, 2017

Related U.S. Application Data

(62) Division of application No. 14/171,986, filed on Feb. 4, 2014, now Pat. No. 9,646,996.

(30) Foreign Application Priority Data

Sep. 11, 2013   (KR) ........................ 10-2013-0109370

(51) Int. Cl.
| | |
|---|---|
| *H01L 27/12* | (2006.01) |
| *G02F 1/1333* | (2006.01) |
| *G02F 1/1335* | (2006.01) |
| *G02F 1/1343* | (2006.01) |
| *G02F 1/1362* | (2006.01) |
| *G02F 1/1368* | (2006.01) |

(52) U.S. Cl.
CPC ........ *G02F 1/1368* (2013.01); *G02F 1/13439* (2013.01); *G02F 1/133345* (2013.01);
(Continued)

(58) Field of Classification Search
CPC .......... G02F 1/13629; G02F 1/136295; G02F 1/134363; G02F 2001/134372;
(Continued)

(56) References Cited

U.S. PATENT DOCUMENTS

| | | |
|---|---|---|
| 7,176,493 B2 | 2/2007 | So et al. |
| 7,995,162 B2 | 8/2011 | Kim et al. |

(Continued)

FOREIGN PATENT DOCUMENTS

| | | |
|---|---|---|
| JP | 08262491 A | 10/1996 |
| JP | 2002319321 A | 10/2002 |

(Continued)

*Primary Examiner* — Jessica M Merlin
(74) *Attorney, Agent, or Firm* — Cantor Colburn LLP

(57) ABSTRACT

A thin film transistor array panel includes a first substrate, a gate line disposed on the first substrate and includes a lower layer including titanium, a middle layer including a transparent conductive material, and an upper layer including copper, a pixel electrode disposed on the first substrate and includes a lower layer including titanium, and an upper layer including the transparent conductive material, a gate insulating layer disposed on the gate line and the pixel electrode, a semiconductor layer disposed on the gate insulating layer, a data line and a drain electrode disposed on the semiconductor layer, a passivation layer which covers the data line and the drain electrode, and a common electrode disposed on the passivation layer.

5 Claims, 20 Drawing Sheets

(52) U.S. Cl.
CPC .. *G02F 1/133514* (2013.01); *G02F 1/136286* (2013.01); *H01L 27/124* (2013.01); *H01L 27/1225* (2013.01); *H01L 27/1262* (2013.01); *G02F 2001/13629* (2013.01); *G02F 2001/136295* (2013.01); *G02F 2201/121* (2013.01); *G02F 2201/123* (2013.01)

(58) Field of Classification Search
CPC ... G02F 2001/134381; G02F 1/136286; G02F 2001/13629; G02F 2001/136295; H01L 27/124
See application file for complete search history.

(56) References Cited

U.S. PATENT DOCUMENTS

| | | | |
|---|---|---|---|
| 2005/0263769 A1* | 12/2005 | Chul Ahn | G02F 1/136286 257/72 |
| 2007/0109455 A1* | 5/2007 | Kim | G02F 1/133555 349/43 |
| 2008/0088778 A1* | 4/2008 | Huang | G02F 1/133555 349/114 |
| 2008/0169469 A1* | 7/2008 | Kawamura | H01L 27/12 257/59 |
| 2009/0267087 A1 | 10/2009 | Yang et al. | |
| 2012/0162162 A1 | 6/2012 | Kong et al. | |
| 2013/0148072 A1 | 6/2013 | Jang et al. | |
| 2015/0034942 A1 | 2/2015 | Kim et al. | |

FOREIGN PATENT DOCUMENTS

| | | |
|---|---|---|
| JP | 2003017706 A | 1/2003 |
| JP | 3603496 B2 | 10/2004 |
| KR | 1020040005040 A | 1/2004 |
| KR | 100524250 B1 | 10/2005 |
| KR | 100663288 B1 | 12/2006 |
| KR | 101146490 B1 | 5/2012 |
| KR | 1020130051603 A | 5/2013 |

* cited by examiner

THIN FILM TRANSISTOR SUBSTRATE AND MANUFACTURING METHOD THEREOF

This application is a divisional of U.S. patent application Ser. No. 14/171,986, filed on Feb. 4, 2014, which claims priority to Korean Patent Application No. 10-2013-0109370 filed on Sep. 11, 2013, and all the benefits accruing therefrom under 35 U.S.C. § 119, the entire contents of which are incorporated herein by reference.

BACKGROUND (a) Field

The invention relates to a thin film transistor ("TFT") array panel, a liquid crystal display, and a manufacturing method of a TFT array panel.

(b) Description of the Related Art

A liquid crystal display ("LCD") is one of the most commonly used flat panel displays, and it includes two substrates with electrodes formed thereon and a liquid crystal layer interposed between the two substrates. In the LCD, a voltage is applied to the electrodes to realign liquid crystal molecules of the liquid crystal layer to thereby regulate a transmittance of light passing through the liquid crystal layer.

Recently, due to a preference for a large screen for smart phones and tablet personal computers ("PCs"), attempts to minimize a bezel of the LCD are continuously made.

SUMMARY

The invention provides a thin film transistor ("TFT") array panel with minimized gate line reflection by applying an indium zinc oxide ("IZO") middle layer to a gate line.

The invention also provides a liquid crystal display ("LCD") with a minimized bezel by using an upper panel as a TFT array panel and a lower panel as a substrate corresponding thereto.

Further, the invention provides a manufacturing method of a TFT array panel.

A TFT array panel according to an exemplary embodiment of the invention includes a first substrate, a gate line which is disposed on the first substrate and includes a lower layer including titanium, a middle layer including a transparent conductive material, and an upper layer including copper, a pixel electrode which is disposed on the first substrate and includes a lower layer including titanium, and an upper layer including a transparent conductive material, a gate insulating layer disposed on the gate line and the pixel electrode, a semiconductor layer disposed on the gate insulating layer, a data line and a drain electrode disposed on the semiconductor layer, a passivation layer covering the data line and the drain electrode, and a common electrode disposed on the passivation layer.

In an exemplary embodiment, the gate line and the pixel electrode may be positioned in or on a same plane surface.

In an exemplary embodiment, a contact hole exposing the pixel electrode may be defined in the gate insulating layer. The pixel electrode is electrically and physically connected to the drain electrode through the contact hole.

In an exemplary embodiment, the transparent conductive material of the gate line and the pixel electrode may IZO.

In an exemplary embodiment, a thickness of the lower layer of the gate line and the pixel electrode including titanium in a cross section may be in a range of about 20 angstrom (Å) to about 200 Å.

In an exemplary embodiment, a thickness of the middle layer of the gate line and the upper layer of the pixel electrode including the IZO in the cross section may be in a range of about 400 Å to about 500 Å.

In an exemplary embodiment, a TFT array panel according to another exemplary embodiment of the invention includes a first substrate, a gate which is disposed on the first substrate, and includes a lower layer including titanium, a middle layer including a transparent conductive material, and an upper layer including copper, a pixel electrode which is disposed on the first substrate and includes a lower layer including titanium; and an upper layer including a transparent conductive material, a gate insulating layer disposed on the gate line and the common electrode, a semiconductor layer disposed on the gate insulating layer, a data line and a drain electrode disposed on the semiconductor layer, a passivation layer covering the data line and the drain electrode and a contact hole which is defined in the passivation layer and exposes a part of the drain electrode, and a pixel electrode electrically connected to the drain electrode through the contact hole.

In an exemplary embodiment, the gate line and the common electrode may be positioned in or on a same plane surface.

In an exemplary embodiment, the transparent conductive material of the gate line and the common electrode may be IZO.

In an exemplary embodiment, a thickness of the lower layer including titanium of the gate line and the common electrode in the cross section may be in a range of about 20 Å to about 200 Å.

In an exemplary embodiment, a thickness of the middle layer of the gate line and the upper layer of the common electrode including the IZO in the cross section may be in a range of about 400 Å to about 500 Å.

An LCD according to an exemplary embodiment of the invention includes a first substrate, a gate line which is disposed on the first substrate and includes a lower layer including titanium, a middle layer including a transparent conductive material, and an upper layer including copper, a common electrode which is disposed on the first substrate and includes a lower layer including titanium, and an upper layer including a transparent conductive material, a gate insulating layer disposed on the gate line and the pixel electrode, a semiconductor layer disposed on the gate insulating layer, a data line and a drain electrode disposed on the semiconductor layer, a passivation layer covering the data line and the drain electrode, a common electrode disposed on the passivation layer, a second substrate, a color filter positioned on the second substrate, and a light source positioned under the second substrate.

An LCD according to another exemplary embodiment of the invention includes a first substrate, a gate line which is disposed on the first substrate and includes a lower layer including titanium, a middle layer including a transparent conductive material, and an upper layer including copper, a common electrode which is disposed on the first substrate and includes a lower layer including titanium, and an upper layer including a transparent conductive material, a gate insulating layer disposed on the gate line and the common electrode, a semiconductor layer disposed on the gate insulating layer, a data line and a drain electrode disposed on the semiconductor layer, a passivation layer covering the data line and the drain electrode and a contact hole which is defined in the passivation layer and exposes a part of the drain electrode, a pixel electrode electrically connected to the drain electrode through the contact hole, a second substrate facing the first substrate, a color filter positioned on the second substrate, and a light source positioned under the second substrate.

A manufacturing method of a TFT array panel according to an exemplary embodiment of the invention includes sequentially depositing a lower layer including titanium, a middle layer including IZO, and an upper layer including copper on a substrate, forming a gate line and a pixel electrode by using an etchant that etches titanium and copper, selectively etching copper on the pixel electrode by using an etchant selectively only etches copper, forming a gate insulating layer which covers the gate line and the pixel electrode, and defining a contact hole exposing a part of the pixel electrode in the gate insulating layer, forming a semiconductor layer on the gate insulating layer, forming a data line and a drain electrode connected to the pixel electrode through the contact hole on the semiconductor layer, forming a passivation layer covering the data line and the drain electrode, and forming a common electrode on the passivation layer.

In an exemplary embodiment, a thickness of the lower layer including titanium in the cross section may be in a range of about 20 Å to 200 Å.

In an exemplary embodiment, a thickness of the middle layer including the IZO may in the cross section be in a range of about 400 Å to about 500 Å.

In an exemplary embodiment, a plurality of cutouts may be defined in the common electrode, and the common electrode includes a plurality of branch electrodes defined by the plurality of cutouts.

A manufacturing method of a TFT array panel according to another exemplary embodiment of the invention includes sequentially depositing a lower layer including titanium, a middle layer including IZO, and an upper layer including copper on a substrate, forming a gate line and a common electrode by using an etchant that etches titanium and copper, selectively etching copper on the common electrode by using an etchant that selectively only etches copper, forming a gate insulating layer which covers the gate line and the common electrode, forming a semiconductor layer, a data line, and a drain electrode on the gate insulating layer, forming a passivation layer which covers the data line and the drain electrode, defining a contact hole exposing a part of the common electrode in the passivation layer, and forming a pixel electrode connected to the drain electrode through the contact hole on the passivation layer.

In an exemplary embodiment, a thickness of the lower layer including titanium in the cross section may be in a range of about 20 Å to about 200 Å.

In an exemplary embodiment, a thickness of the middle layer including the IZO in the cross section may be in a range of about 400 Å to about 500 Å.

According to an exemplary embodiment of the invention, by inserting the middle layer of IZO between the lower layer including titanium of the gate line and the upper layer including copper, a TFT array panel with minimized reflectance of the gate line is provided. Also, when manufacturing the TFT array panel according to an exemplary embodiment of the invention, the gate line and the pixel electrode or the common electrode are simultaneously provided, thereby simplifying a manufacturing process. The LCD using the TFT array panel of the invention includes the TFT array panel as the upper panel and the opposing panel as the lower panel, thereby minimizing the bezel.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
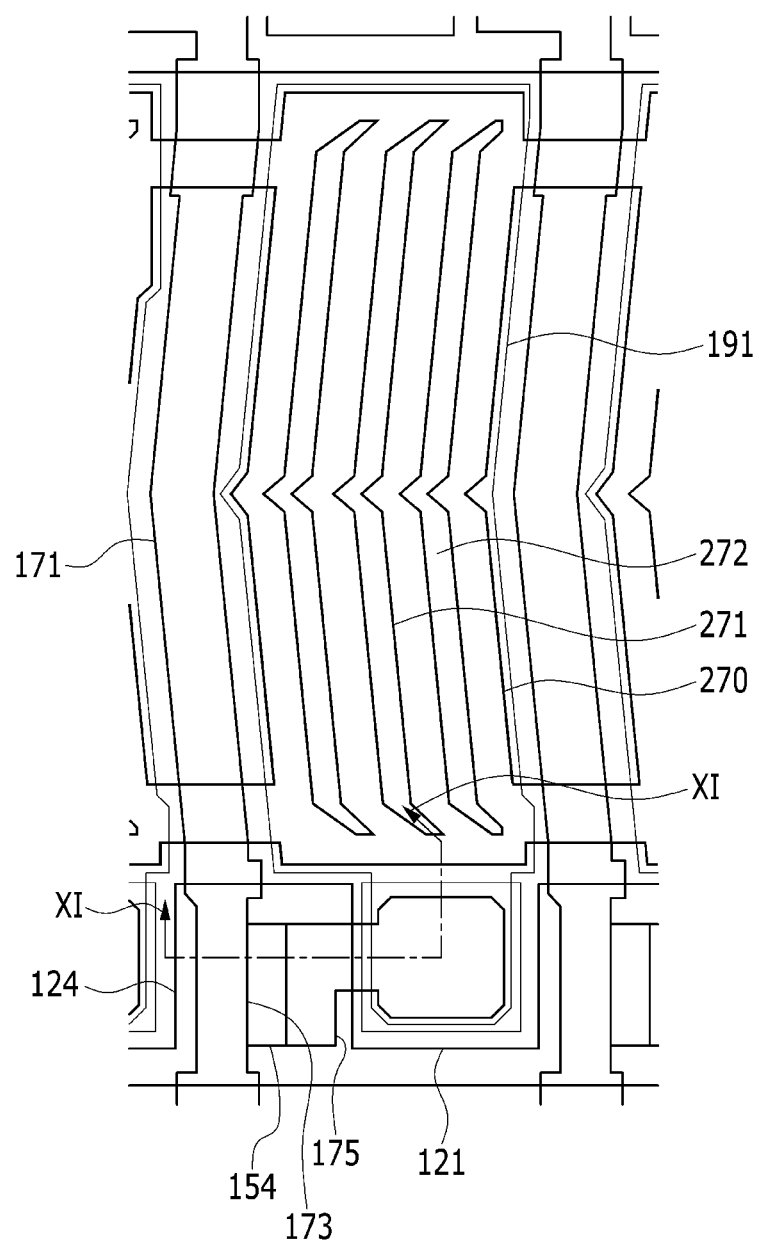
FIG. 1 is a plan view of an exemplary embodiment of a thin film transistor ("TFT") array panel according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Now, a thin film transistor ("TFT") array panel according to an exemplary embodiment of the invention will be described with reference to FIGS. 1 and 2.

Figure 2:
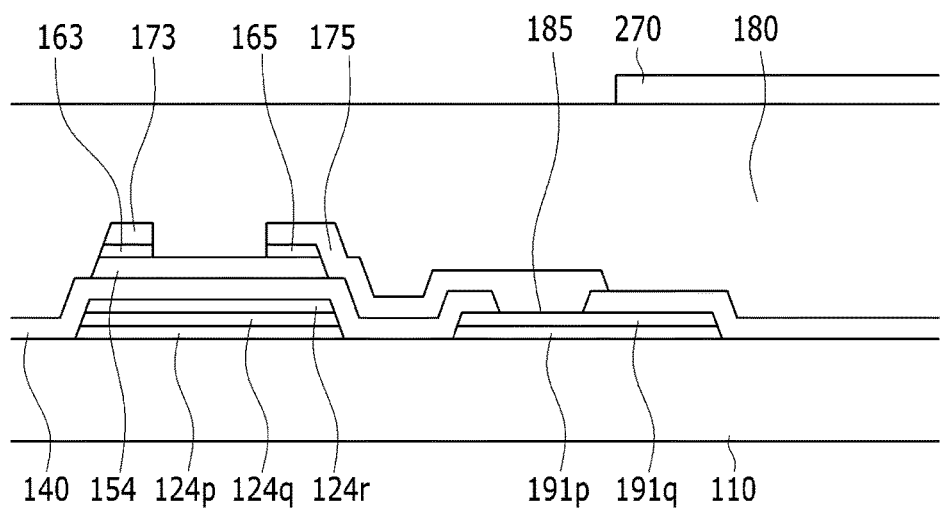
FIG. 2 is a cross-sectional view of an exemplary embodiment of the TFT array panel shown in FIG. 1 taken along line XI-XI.

FIG. 1 is a plan view of a TFT array panel according to an exemplary embodiment of the invention, and FIG. 2 is a cross-sectional view of the TFT array panel shown in FIG. 1 taken along line XI-XI.

Referring to FIGS. 1 and 2, a plurality of gate lines 121 are disposed on an insulation substrate 110 including transparent glass or plastic.

The gate lines 121 transmit a gate signal and extend in a transverse direction. Each gate line 121 includes a plurality of gate electrodes 124 protruding from the gate line 121.

The gate line 121 and the gate electrode 124 have a triple-layered structure. In an exemplary embodiment, the gate electrode 124 includes lower layer 124$p$, middle layer 124$q$, and upper layer 124$r$. In an exemplary embodiment, the lower layer 124$p$ may include titanium (Ti) or a titanium alloy, and the upper layer 124$r$ may include copper (Cu) or a copper alloy, for example. In an exemplary embodiment, the middle layer 124$q$ includes indium zinc oxide ("IZO"), for example.

The side surface of the gate lines 121 is inclined with respect to the substrate 110, and the angle of inclination between each side surface and the substrate may be in a range of about 30 degrees(° to about 80° in a cross section.

The lower layer 124$p$ of the gate line may have a thickness taken in a cross section of about 20 angstrom (A) to about 200 Å. Also, the middle layer 124$q$ of the gate line may have a thickness of about 400 Å to about 500 Å. The thickness of the upper layer 124$r$ of the gate line is not particularly limited. The thickness of the lower layer and the middle layer may be in a range such that light reflected from the lower layer including titanium generates destructive interference with light reflected from the IZO middle layer, thereby minimizing reflection of the gate line.

Figure 5:
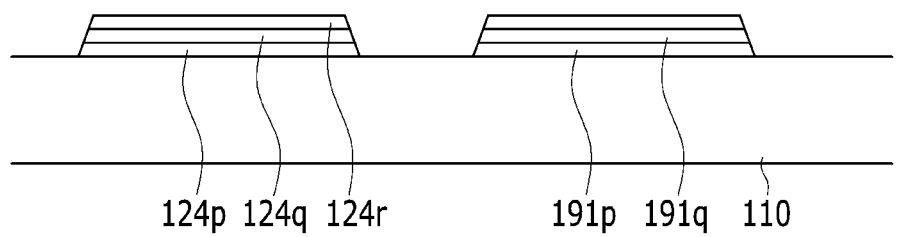

Referring to FIGS. 1 and 2, a plurality of pixel electrodes 191 having the same height as the gate line in a cross section are disposed on the insulation substrate 110 (refers to FIG. 5). The pixel electrode 191 has a plate-shaped structure corresponding to an opening region (of a light blocking member) to displaying an image by one pixel. That is, the pixel electrode 191 has a continuous plate shape structure for the opening region.

The pixel electrode 191 has a dual-layer structure including a lower layer 191$p$ and an upper layer 191$q$. The lower layer 191$p$ includes titanium (Ti) or a titanium alloy, and the upper layer 191$q$ includes IZO.

In an exemplary embodiment, the lower layer 191$p$ of the pixel electrode may have a thickness of about 20 Å to about 200 Å, and the upper layer 191$q$ of the pixel electrode may have a thickness of about 400 Å to about 500 Å.

The gate line and the pixel electrode are simultaneously deposited by the same process such that the thickness and the constituent material of the lower layer 124$p$ of the gate line and the lower layer 191$p$ of the pixel electrode may be the same, and the thickness and the constituent material of the middle layer 124$q$ of the gate line and the upper layer 191$q$ of the pixel electrode may be the same. The lower layer 124$p$ of the gate line and the lower layer 191$p$ of the pixel electrode may be in a same layer, and the middle layer 124$q$ of the gate line and the upper layer 191$q$ of the pixel electrode may be in a same layer.

A gate insulating layer 140 including a silicon nitride (SiNx) or a silicon oxide (SiOx) is disposed on the gate line 121 and the pixel electrode 191. In an exemplary embodiment, the gate insulating layer 140 may have a multilayered structure including at least two insulating layers having different physical properties.

A contact hole 185 exposing the pixel electrode 191 is defined in the gate insulating layer 140. The pixel electrode 191 is physically and electrically connected to a drain electrode 175 through the contact hole 185 thereby receiving a voltage from the drain electrode 175.

A semiconductor 154 including amorphous silicon or polysilicon is disposed on the gate insulating layer 140. In an exemplary embodiment, the semiconductor 154 may include an oxide semiconductor.

Ohmic contacts 163 and 165 are disposed on the semiconductor 154. In an exemplary embodiment, the ohmic contacts 163 and 165 may include a material such as n+ hydrogenated amorphous silicon in which an n-type impurity such as phosphorus is doped at a high concentration, or a silicide, for example. The ohmic contacts 163 and 165 may be disposed as a pair on the semiconductor 154. In the case where the semiconductor 154 is the oxide semiconductor, the ohmic contacts 163 and 165 may be omitted.

In an exemplary embodiment, a side surface of each of the semiconductors 154 and the ohmic contacts 163 and 165 is inclined with respect to the surface of the substrate 110, and the inclination angle is in a range of about 30° to about 80° in a cross section.

A data conductor including a data line 171 including a source electrode 173 and a drain electrode 175 is positioned on the ohmic contacts 163 and 165 and the gate insulating layer 140.

The data line 171 includes a wide end portion (not illustrated) for connection with another layer or an external driving circuit. The data line 171 transmits a data signal, and is extended in a substantially vertical direction to intersect the gate line 121.

The data lines 171 may have first curved portions having a curved shape in order to secure maximum transmittance, and the curved portions may meet at a center area of a pixel area to be disposed in a V-shape in a plan view. Second curved portions bent at a predetermined angle with respect to the first curved portions may be further included in the center area of the pixel area.

In an exemplary embodiment, the first curved portion of the data line 171 may be bent at approximately 7° with respect to a vertical reference line which forms an angle of about 90° with respect to a direction in which the gate line 121 is extended. In an exemplary embodiment, the second curved portion disposed at the center area of the pixel area may be further bent to form an angle of approximately 7° to approximately 15° with respect to the first curved portion.

The source electrode 173 is a part of the data line 171 and is disposed on the same line as the data line 171 in a plan view. The drain electrode 175 is provided to be extended in parallel to the source electrode 173. Accordingly, the drain electrode 175 is parallel to a part of the data line 171.

The gate electrode 124, the source electrode 173, and the drain electrode 175 form a single TFT together with the semiconductor layer 154, and a channel of the TFT is disposed on the semiconductor layer 154 between the source electrode 173 and the drain electrode 175.

In an exemplary embodiment, the data line 171 and the drain electrode 175 may include a refractory metal, such as molybdenum, chromium, tantalum, and titanium, or an alloy thereof, and may have a multilayer structure including a refractory metal layer (not illustrated) and a low resistance conductive layer (not illustrated). Examples of the multilayer structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer, for example. However, the data line 171 and the drain electrode 175 may include various other metals or conductors. A width of the data line 171 in a plan view may be in a range of about 3.5 micrometers (μm)±0.75 μm.

In an exemplary embodiment, the sides of the data lines 171 and the sides of the drain electrodes 175 are also sloped with regard to the surface of the substrate 110 at a slope angle within a range of about 30° to about 80°.

A passivation layer 180 is disposed on the data conductors 171, 173, and 175, the gate insulating layer 140, and the exposed portion of the semiconductor 154. The passivation layer 180 may include an organic insulating material or an inorganic insulating material. The inorganic insulator may be a silicon nitride or a silicon oxide. In an exemplary embodiment, the organic insulating material may have photosensitivity, and a dielectric constant thereof may be less than about 4.0. In an alternative exemplary embodiment, the passivation layer 180 may have a double-layered structure including a lower inorganic layer and an upper organic layer in order not to harm the exposed portions of the semiconductors 154 as well as to take advantage of the excellent insulating characteristics of the organic layer.

A common electrode 270 is disposed on the passivation layer 180. The common electrode 270 includes a curved edge that is almost parallel to the first bent portion and a second bent portion of the data line 171 in a plan view, and common electrodes 270 disposed in adjacent pixels are connected to each other. A plurality of second cutouts 272 is defined in the common electrode 270, and the common electrode 270 includes a plurality of second branch electrodes 271 defined by the plurality of second cutouts 272.

The common electrodes 270 positioned in adjacent pixels are connected thereby receiving a common voltage of a predetermined magnitude supplied from outside of the display area.

The pixel electrodes 191 to which a data voltage is applied and the common electrode that receives a common voltage generate an electric field, thereby determining a direction of liquid crystal molecules of a liquid crystal layer (not shown) between the two electrodes. As the pixel electrodes 191 and the common electrode form a capacitor (hereinafter referred to as a "liquid crystal capacitor"), an applied voltage is sustained even after a TFT is turned off.

Next, a liquid crystal display ("LCD") according to an exemplary embodiment of the invention will be described with reference to FIGS. 1 and 3.

The LCD according to an exemplary embodiment of the invention has a shape of which a conventional LCD is flipped, and includes a TFT array panel positioned at a top side (e.g., a viewing side of the LCD) and an opposing panel positioned at a bottom side (e.g., a rear side of the LCD). When the TFT array panel is positioned at the bottom side, a transistor driver is disposed at an edge and a space to cover the transistor driver is required such that there is a limitation to bezel minimization. However, when the TFT array panel is positioned at the top side, it is not necessary to cover the transistor driver such that the bezel may be minimized. Also, since a substrate of the TFT array panel is larger than the opposing panel, when the TFT array panel is positioned at the top side, a glass surface may be further increased. Accordingly, compared with a structure in which the conventional TFT array panel is positioned at the lower side, the bezel may be minimized, and a structure in which the glass is disposed on a front surface is possible.

However, when the TFT array panel is disposed at the upper side, the gate line and the pixel electrode are exposed to the surface of the LCD. Therefore, surface reflectance of the LCD is increased by the exposed gate line and the contrast ratio is deteriorated. Accordingly, in the flip-type LCD, it is important to effectively reduce the surface reflectance by the exposed gate line. The LCD according to an exemplary embodiment of the invention uses the TFT array panel provided with the structure including the gate line of the IZO dual-layered structure, thereby minimizing the reflectance of the gate line.

Next, the LCD according to an exemplary embodiment of the invention will be described with reference to FIG. 3. In the LCD according to an exemplary embodiment of the invention, the TFT array panel is positioned at the upper side (e.g., the viewing side of the LCD) and the opposing panel is positioned at the lower side (e.g., the rear side of the LCD). That is, in a conventional display, a light source is positioned under the TFT array panel, but in contrast, in the liquid crystal display of the invention, the light source is positioned at the opposing panel and the surface that is actually recognized is the TFT array panel.

Firstly, the upper panel 100 will be described.

A plurality of gate lines are disposed on an insulation substrate 110 including transparent glass or plastic.

The gate lines 121 transmit the gate signal and extend in the transverse direction. Each gate line 121 includes a plurality of gate electrodes 124 protruding from the gate line 121.

The gate line 121 and the gate electrode 124 have a triple-layered structure including lower layer 124*p*, middle layer 124*q*, and upper layer 124*r*. The lower layer 124*p* may include titanium (Ti) or a titanium alloy, and the upper layer 124*r* may include copper (Cu) or a copper alloy. The middle layer 124*q* includes IZO.

The side surface of the gate lines 121 is inclined with respect to the substrate 110, and the angle of inclination between each side surface and the substrate may be in the range of about 30° to about 80°.

The lower layer 124*p* of the gate line may have a thickness of about 20 Å to about 200 Å. The middle layer 124*q* of the gate line may have a thickness of about 400 Å to about 500 Å. The thickness of the upper layer 124*r* of the gate line is not particularly limited. The thickness of the lower layer and the middle layer may be in a range such that light reflected from the lower layer including titanium generates destructive interference with light reflected from the IZO middle layer, thereby minimizing reflection of the gate line.

Figure 3:
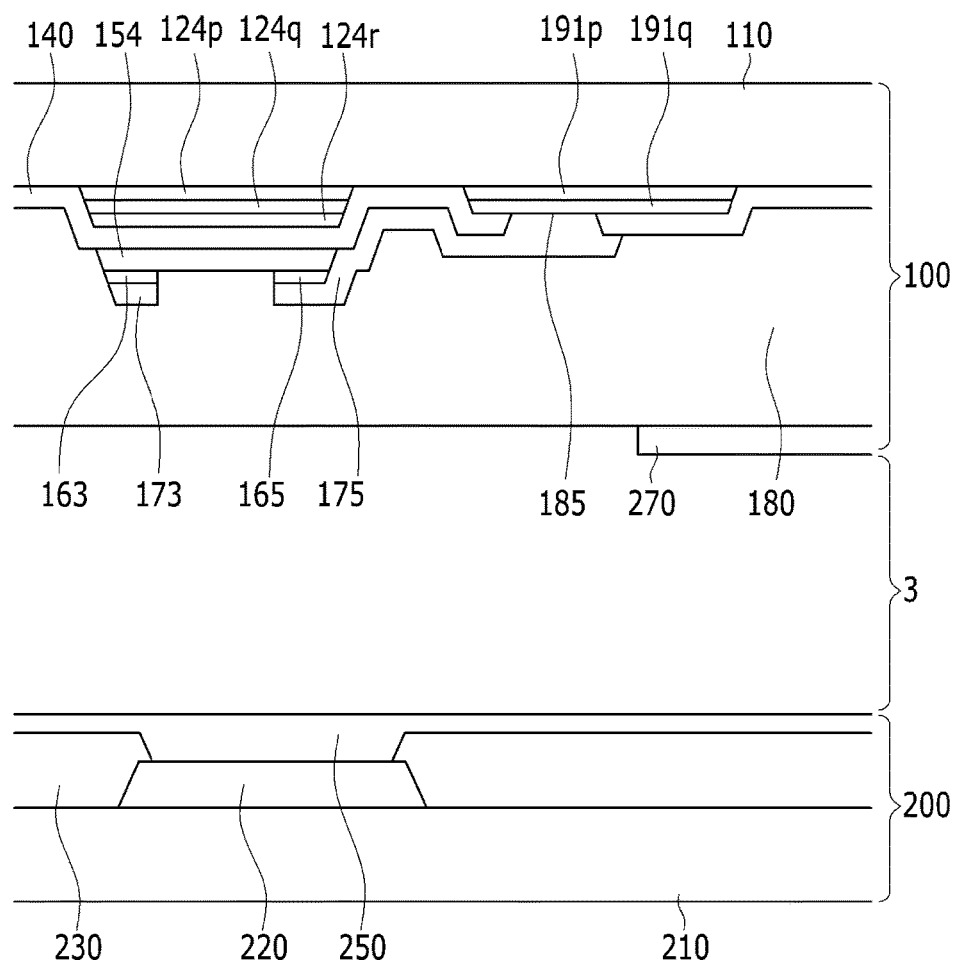
FIG. 3 is a cross-sectional view of a liquid crystal display ("LCD") including the TFT array panel shown in FIG. 2.

Referring to FIGS. 1 and 3, a plurality of pixel electrodes 191 having the same height as the gate lines are formed on the insulation substrate 110 (refers to FIG. 5). The pixel electrode 191 has the plate-shape structure corresponding to the opening region (of the light blocking member) to displaying an image by one pixel. That is, the pixel electrode 191 has the continuous plate-shape structure for the opening region. The pixel electrode 191 has a dual-layer structure including a lower layer 191*p* and an upper layer 191*q*. The lower layer 191*p* includes titanium (Ti) or a titanium alloy, and the upper layer 191*q* includes IZO.

In an exemplary embodiment, the lower layer 191*p* of the pixel electrode may have a thickness of about 20 Å to about 200 Å. The upper layer 191*q* of the pixel electrode may have a thickness of about 400 Å to about 500 Å.

The gate line and the pixel electrode are simultaneously deposited by the same process such that the thickness and the constituent material of the lower layer 124*p* of the gate line and the lower layer 191*p* of the pixel electrode may be the same, and the thickness and the constituent material of the middle layer 124*q* of the gate line and the upper layer 191*q* of the pixel electrode may be the same. The lower layer 124*p* of the gate line and the lower layer 191*p* of the pixel electrode may be in a same layer, and the middle layer 124*q* of the gate line and the upper layer 191*q* of the pixel electrode may be in a same layer.

A gate insulating layer 140 including a silicon nitride (SiNx) or a silicon oxide (SiOx) is disposed on the gate line 121 and the pixel electrode 191. The gate insulating layer 140 may have a multilayered structure including at least two insulating layers having different physical properties.

A contact hole 185 exposing the pixel electrode 191 is defined in the gate insulating layer 140. The pixel electrode 191 is physically and electrically connected to the drain electrode 175 through the contact hole 185 thereby receiving a voltage from the drain electrode 175.

A semiconductor 154 including amorphous silicon or polysilicon is disposed on the gate insulating layer 140. The semiconductor 154 may include the oxide semiconductor.

The ohmic contacts 163 and 165 are disposed on the semiconductor 154. The ohmic contacts 163 and 165 may include a material such as n+ hydrogenated amorphous silicon in which an n-type impurity such as phosphorus is doped at a high concentration, or a silicide. The ohmic contacts 163 and 165 may be disposed as a pair on the semiconductor 154. In the case where the semiconductor 154 is the oxide semiconductor, the ohmic contacts 163 and 165 may be omitted.

In an exemplary embodiment, a side surface of each of the semiconductors 154 and the ohmic contacts 163 and 165 is inclined with respect to the surface of the substrate 110, and the inclination angle is in a range of about 30° to about 80°.

A data conductor including a data line 171 including a source electrode 173 and a drain electrode 175 is positioned on the ohmic contacts 163 and 165 and the gate insulating layer 140.

The data line 171 includes the wide end portion (not illustrated) for connection with another layer or an external driving circuit. The data line 171 transmits a data signal, and is extended in a substantially vertical direction to intersect the gate line 121.

The data lines 171 may have the first curved portions having a curved shape in order to secure maximum transmittance, and the curved portions may meet at the center area of the pixel area to be disposed in the V-shape. The second curved portions bent at a predetermined angle with respect to the first curved portions may be further included in the center area of the pixel area.

In an exemplary embodiment, the first curved portion of the data line 171 may be bent at approximately 7° with respect to the vertical reference line which forms an angle of about 90° with respect to the direction in which the gate line 121 is extended. In an exemplary embodiment, the second curved portion disposed at the center area of the pixel area may be bent to form an angle of approximately 7° to approximately 15° with respect to the first curved portion.

The source electrode 173 is a part of the data line 171 and is disposed on the same line as the data line 171. The drain electrode 175 is provided to be extended in parallel to the source electrode 173. Accordingly, the drain electrode 175 is parallel to a part of the data line 171.

The gate electrode 124, the source electrode 173, and the drain electrode 175 form a single TFT together with the semiconductor layer 154, and a channel of the TFT is disposed on the semiconductor layer 154 between the source electrode 173 and the drain electrode 175.

Further, the data line 171 and the drain electrode 175 may include a refractory metal, such as molybdenum, chromium, tantalum, and titanium, or an alloy thereof, and may have a multilayer structure including a refractory metal layer (not illustrated) and a low resistance conductive layer (not illustrated). Examples of the multilayer structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the data line 171 and the drain electrode 175 may include various other metals or conductors. The width of the data line 171 may be in a range of about 3.5 µm±0.75 µm.

In an exemplary embodiment, the sides of the data lines 171 and the sides of the drain electrodes 175 are sloped with regard to the surface of the substrate 110 at a slope angle within a range of about 30° to about 80°.

A passivation layer 180 is disposed on the data conductors 171, 173, and 175, the gate insulating layer 140, and the exposed portion of the semiconductor 154. The passivation layer 180 may include an organic insulating material or an inorganic insulating material. In an exemplary embodiment, the inorganic insulator may be a silicon nitride or a silicon oxide. In an exemplary embodiment, the organic insulating material may have photosensitivity, and a dielectric constant thereof may be less than about 4.0. In an alternative exemplary embodiment, the passivation layer 180 may have a double-layered structure including a lower inorganic layer and an upper organic layer in order not to not harm the exposed portions of the semiconductors 154 as well as to take advantage of the excellent insulating characteristics of the organic layer.

A common electrode 270 is disposed on the passivation layer 180. The common electrode 270 includes the curved edge that is almost parallel to the first bent portion and the second bent portion of the data line 171, and common electrodes 270 disposed in adjacent pixels are connected to each other. A plurality of second cutouts 272 is defined in the common electrode 270, and the common electrode 270 includes a plurality of second branch electrodes 271 defined by the plurality of second cutouts 272.

The common electrodes 270 positioned in the adjacent pixels are connected, thereby receiving the common voltage of the predetermined magnitude supplied from outside of the display area.

The pixel electrodes 191 to which the data voltage is applied and the common electrode that receives the common voltage generate an electric field, thereby determining the direction of liquid crystal molecules of a liquid crystal layer (not shown) between the two electrodes. As the pixel electrodes 191 and the common electrode form a capacitor (hereinafter also referred to as "a liquid crystal capacitor"), an applied voltage is sustained even after the TFT is turned off.

Next, the lower panel 200 will be described.

A light blocking member 220 in which an opening is defined is disposed on an insulation substrate 210 including transparent glass or plastic. The light blocking member 220 is also referred to as a black matrix and prevents light leakage.

A plurality of color filters 230 is disposed on the substrate 210. The color filters 230 cover the openings of the light blocking member 220. The color filters may be disposed in the upper panel 100, and in this case the color filters disposed in the lower panel 200 may be omitted. In another exemplary embodiment, the light blocking member 220 of the lower panel 200 may be disposed in the upper panel 100.

An overcoat 250 is disposed on the color filter 230 and the light blocking member 220. The overcoat 250 may include an (organic) insulating material. The overcoat 250 prevents the color filters 230 from being exposed and provides a planar surface. The overcoat 250 may be omitted.

In an exemplary embodiment, an alignment layer (not shown) may be disposed on the overcoat 250.

The liquid crystal layer 3 includes a nematic liquid crystal material having positive dielectric anisotropy. The liquid crystal molecules of the liquid crystal layer 3 are arranged so that a direction of elongated axes of the liquid crystal molecules is parallel to the panels 100 and 200, and have a structure in which the direction is spirally deviated by about 90° from a rubbing direction of an alignment layer of the upper panel 100 to the lower panel 200.

The pixel electrode 191 receives the data voltage from the drain electrode 175, and the common electrode 270 receives the common voltage from a common voltage application unit disposed outside the display area.

The pixel electrode 191 and the common electrode 270, which are field generating electrodes, generate an electric field so that liquid crystal molecules of the liquid crystal layer 3 positioned between the two electrodes 191 and 270 rotate in a direction parallel to the direction of the electric field. Polarization of light which passes through the liquid crystal layer varies according to the rotation direction of the liquid crystal molecules determined as described above.

Next, a method of manufacturing the TFT array panel shown in FIGS. 1 and 2 according to an exemplary embodiment of the invention will be described with reference to FIGS. 4 to 10 as well as FIG. 2.

Figure 4:
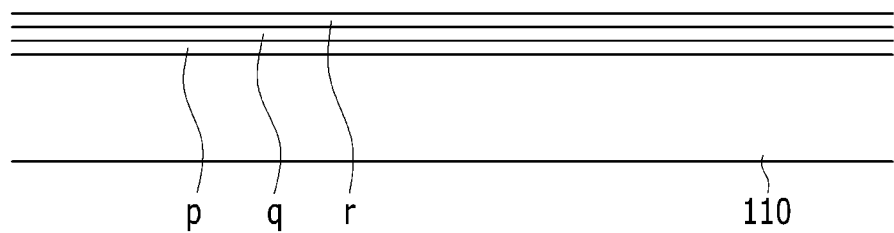
FIGS. 4 to 10 are views sequentially showing an exemplary embodiment of a manufacturing process of the TFT array panel shown in FIG. 1.

Firstly, as shown in FIG. 4, on an insulation substrate 110 including transparent glass or plastic, a lower layer (p) including titanium, a middle layer (q), including a transparent conductive material, and an upper layer (r) including copper are sequentially deposited by sputtering.

Figure 6:
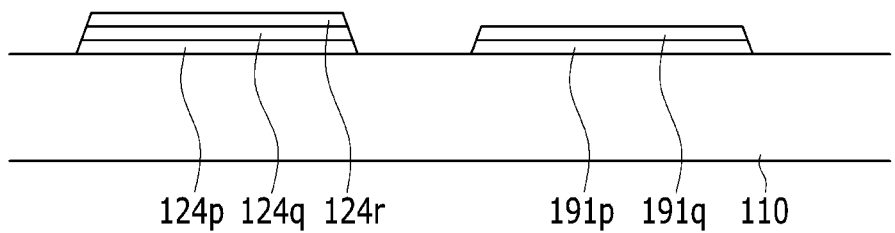

Next, the deposited layers are etched by using an etchant composition etching both copper and titanium. By the etching, as shown in FIG. 5, the gate electrode 124 and the pixel electrode 191 are provided. Next, as shown in FIG. 6, by using an etchant selectively etching copper on the pixel electrode, the copper on the pixel electrode is selectively etched.

Figure 7:
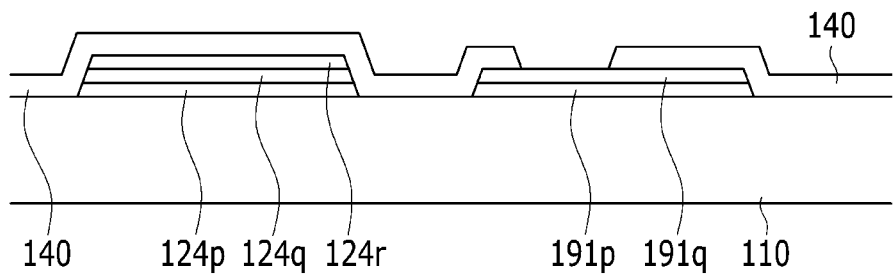

As shown in FIG. 7, a gate insulating layer 140 is then deposited and patterned on the gate electrode and the pixel electrode to define a contact hole 185 exposing the pixel electrode.

Figure 8:
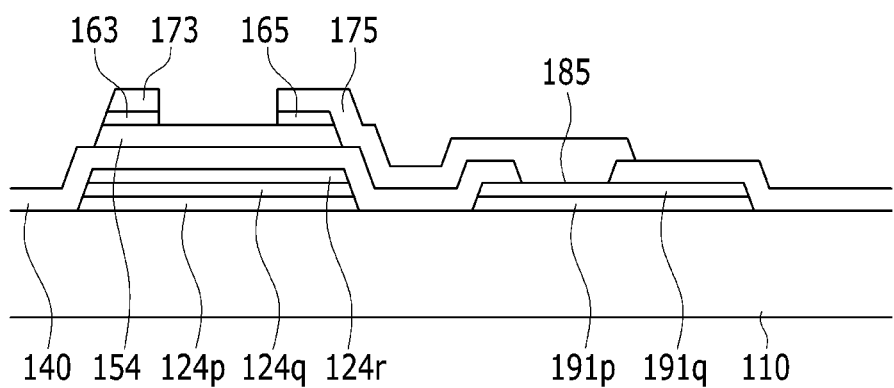

Then, as shown in FIG. 8, a semiconductor 154 and ohmic contacts 163 and 165 are sequentially deposited, and a plurality of data lines 171 including source electrodes 173 and drain electrodes 175 are provided. The drain electrode 175 is electrically connected to the pixel electrode 191 through the contact hole 185 to supply the voltage to the pixel electrode.

Figure 9:
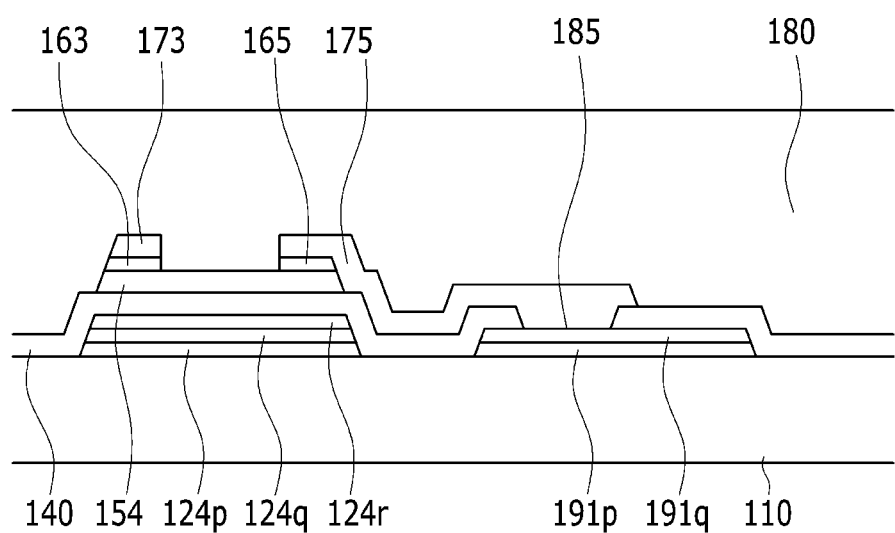
Figure 10:
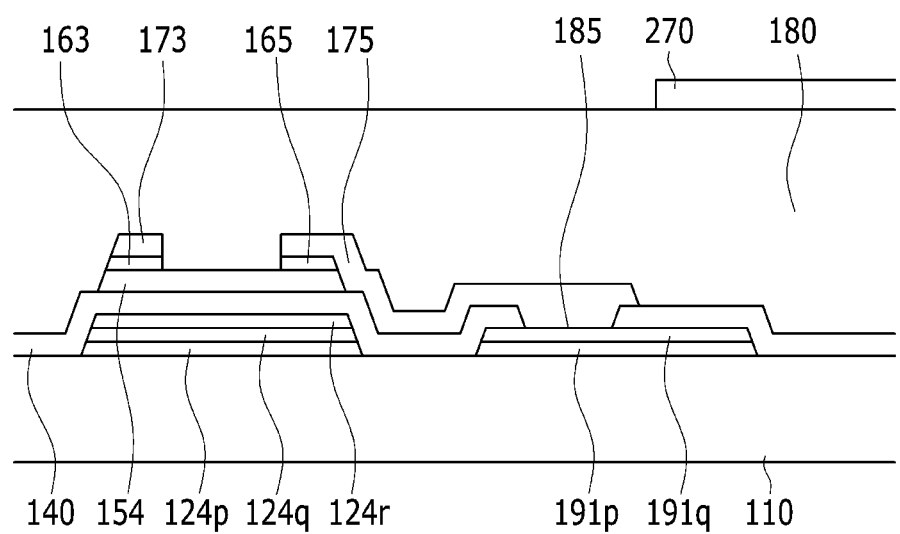

Next, as shown in FIG. 9, a passivation layer 180 is deposited on the data conductors 171, 173, and 175, the gate insulating layer 140, and the exposed portion of the semiconductor 154. As shown in FIG. 10, a common electrode 270 is then deposited on the passivation layer.

Figure 11:
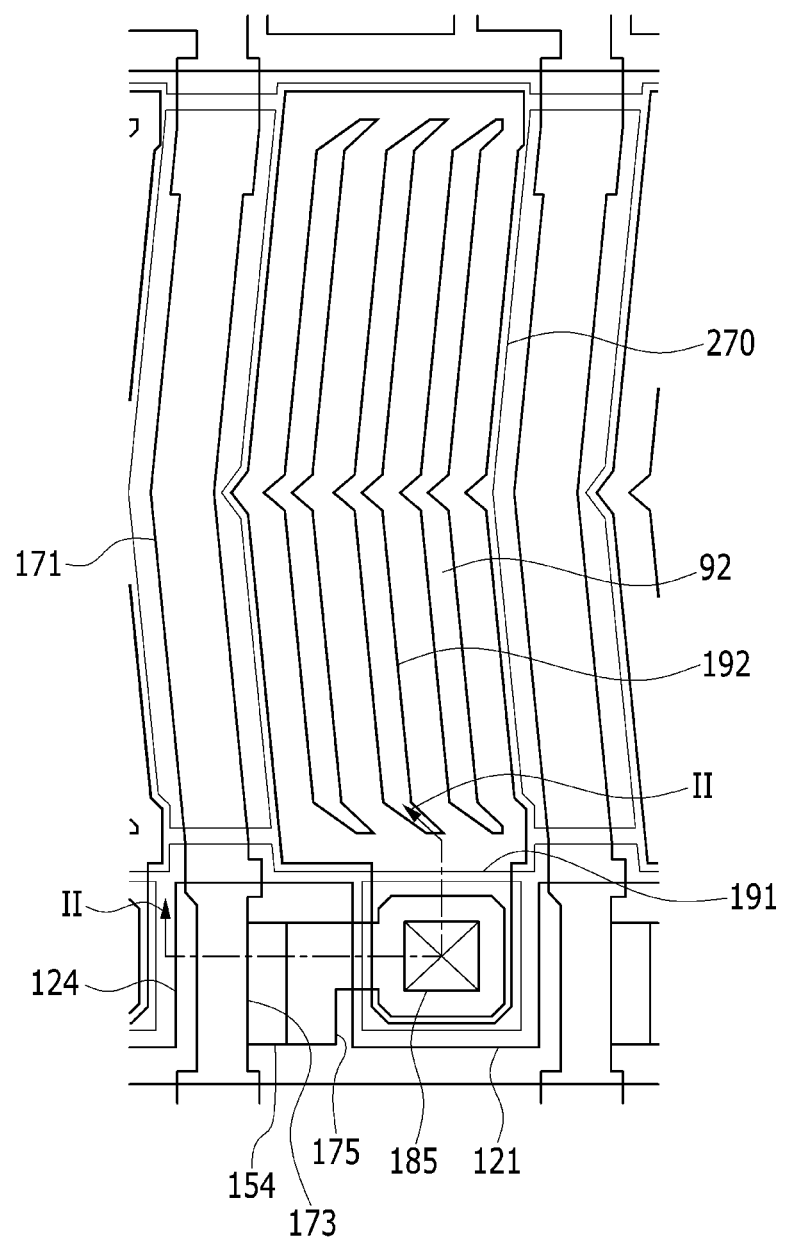
FIG. 11 is a plan view of another exemplary embodiment of a TFT array panel according to the invention.

A TFT array panel according to another exemplary embodiment of the invention will now be described with reference to FIGS. 11 and 12. FIG. 11 is a plan view of a TFT array panel according to another exemplary embodiment of the invention, and FIG. 12 is a cross-sectional view of the TFT array panel according to an exemplary embodiment shown in FIG. 11 taken along line II-II.

Figure 12:
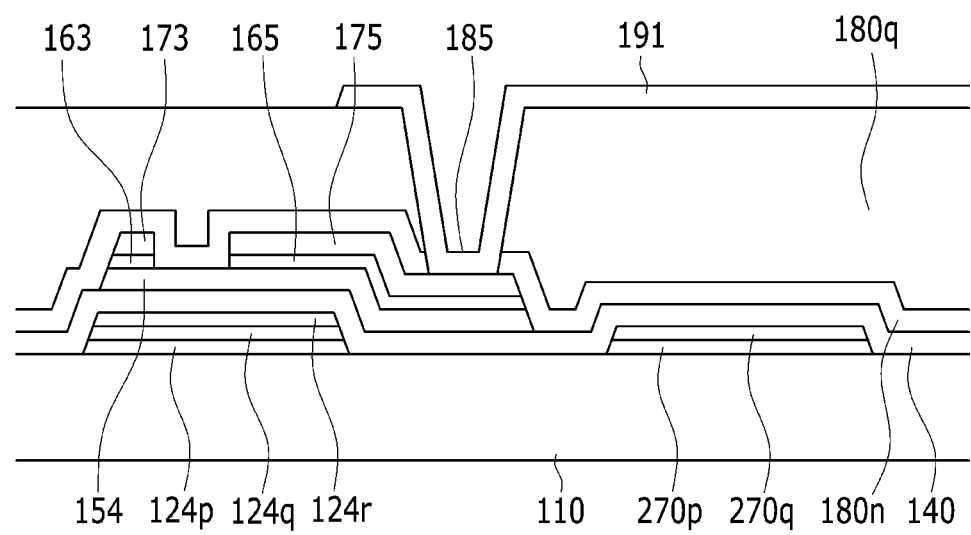
FIG. 12 is a cross-sectional view of an exemplary embodiment of the TFT array panel shown in FIG. 11 taken along line II-II.

The LCD according to the exemplary embodiment of FIGS. 11 and 12 is similar to the TFT array panel according to the exemplary embodiment shown in FIGS. 1 and 2.

Referring to FIGS. 11 and 12, a plurality of gate lines are disposed on an insulation substrate 110 including transparent glass or plastic.

The gate lines 121 transmit a gate signal and extend in a transverse direction. Each gate line 121 includes a plurality of gate electrodes 124 protruding from the gate line 121.

The gate line 121 and the gate electrode 124 have a triple-layered structure including a lower layer 124$p$, a middle layer 124q, and an upper layer 124r. The lower layer 124p may include titanium (Ti) or a titanium alloy, and the upper layer 124r may include copper (Cu) or a copper alloy. The middle layer 124q includes IZO.

The side surface of the gate lines 121 is inclined with respect to the substrate 110 in a cross section, and the angle of inclination between each side surface and the substrate may be in the range of about 30° to about 80°.

The lower layer 124p of the gate line may have a thickness of about 20 Å to about 200 Å in a cross section. The middle layer 124q of the gate line may have a thickness of about 400 Å to about 500 Å. The thickness of the upper layer of the gate line is not particularly limited. The thickness of the lower layer and the middle layer may be in a range that light reflected from the lower layer including titanium generates destructive interference with light reflected from the IZO middle layer, thereby minimizing reflection of the gate line.

Referring to FIGS. 11 and 12, a plurality of common electrodes 270 are disposed on the insulation substrate 110 in and/or on the same plane surface as the gate line. Each common electrode 270 has a plate-shape structure corresponding to the opening region (of the light blocking member) to displaying an image by one pixel. That is, the common electrode 270 has the continuous plate shape structure for the opening region.

The common electrode 270 has a dual-layer structure including a lower layer 270p and an upper layer 270q. The lower layer 270p includes titanium (Ti) or a titanium alloy, and the upper layer 270q includes IZO.

The lower layer 270p of the common electrode may have a thickness of about 20 Å to about 200 Å. The upper layer 270q of the common electrode may have a thickness of about 400 Å to about 500 Å.

The gate line and the common electrode are simultaneously deposited by the same process such that the thickness and the constituent material of the lower layer of the gate line and the lower layer 270p of the common electrode may be the same, and the thickness and the constituent material of the middle layer of the gate line and the upper layer 270q of the common electrode may be the same. The lower layer of the gate line and the lower layer 270p of the common electrode may be in a same layer, and middle layer of the gate line and the upper layer 270q of the common electrode may be in a same layer.

A gate insulating layer 140 including a silicon nitride (SiNx) or a silicon oxide (SiOx) is disposed on the gate line 121 and the common electrode 270. The gate insulating layer 140 may have a multilayered structure including at least two insulating layers having different physical properties from each other.

A semiconductor 154 including amorphous silicon or polysilicon is disposed on the gate insulating layer 140. In an exemplary embodiment, the semiconductor 154 may include the oxide semiconductor.

Ohmic contacts 163 and 165 are disposed on the semiconductor 154. The ohmic contacts 163 and 165 may include a material such as n+ hydrogenated amorphous silicon in which an n-type impurity such as phosphorus is doped at a high concentration, or a silicide. The ohmic contacts 163 and 165 may be disposed in a pair on the semiconductor 154. In the case where the semiconductor 154 is the oxide semiconductor, the ohmic contacts 163 and 165 may be omitted.

A side surface of each of the semiconductors 154 and the ohmic contacts 163 and 165 is inclined with respect to the surface of the substrate 110 in a cross section, and the inclination angle is in a range of about 30° to about 80°.

A data conductor including a data line 171 including a source electrode 173 and a drain electrode 175 is positioned on the ohmic contacts 163 and 165 and the gate insulating layer 140.

The data line 171 includes a wide end portion (not illustrated) for connection with another layer or an external driving circuit. The data line 171 transmits a data signal, and is extended in a substantially vertical direction to intersect the gate line 121.

The source electrode 173 is a part of the data line 171 and is disposed on the same line as the data line 171. The drain electrode 175 is provided to be extended in parallel to the source electrode 173. Accordingly, the drain electrode 175 is parallel to a part of the data line 171.

The gate electrode 124, the source electrode 173, and the drain electrode 175 form a single TFT together with the semiconductor layer 154, and a channel of the TFT is disposed on the semiconductor layer 154 between the source electrode 173 and the drain electrode 175.

In an exemplary embodiment, the data line 171 and the drain electrode 175 may include a refractory metal, such as molybdenum, chromium, tantalum, and titanium, or an alloy thereof, and may have a multilayer structure including a refractory metal layer (not illustrated) and a low resistance conductive layer (not illustrated), for example. Examples of the multilayer structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the data line 171 and the drain electrode 175 may include various other metals or conductors. A width of the data line 171 may be in a range of about 3.5 µm±0.75 µm.

In an exemplary embodiment, the sides of the data lines 171 and the sides of the drain electrodes 175 are sloped to the surface of the substrate 110 at a slope angle within a range of about 30° to about 80°.

A first passivation layer 180n is disposed on the data conductors 171, 173, and 175, the gate insulating layer 140, and the exposed portion of the semiconductor 154. The first passivation layer 180n may include the organic insulating material or the inorganic insulating material.

In an exemplary embodiment, a second passivation layer 180q is disposed on the first passivation layer 180n. The second passivation layer 180q may be omitted. The second passivation layer 180q may be a color filter. When the second passivation layer 180q is the color filter, the second passivation layer 180q may uniquely display one of primary colors, and an example of the primary colors is three primary colors such as red, green, and blue, or yellow, cyan, and magenta, for example. Although it is not illustrated, the color filter may further include a color filter displaying a combination color of the primary colors, or white, other than the primary colors.

A pixel electrode 191 is disposed on the second passivation layer 180q. The pixel electrode 191 includes a curved edge that is almost parallel to the first bent portion and the second bent portion of the data line 171 in a plan view. A plurality of first cutouts 92 is defined in the pixel electrode 191, and the pixel electrode 191 includes a plurality of first branch electrodes 192 defined by the plurality of first cutouts 92.

A first contact hole 185 exposing the drain electrode 175 is defined in the first passivation layer 180n and the second passivation layer 180q. The pixel electrode 191 is physically and electrically connected to the drain electrode 175 through the first contact hole 185, thereby receiving the voltage from the drain electrode 175.

Figure 13:
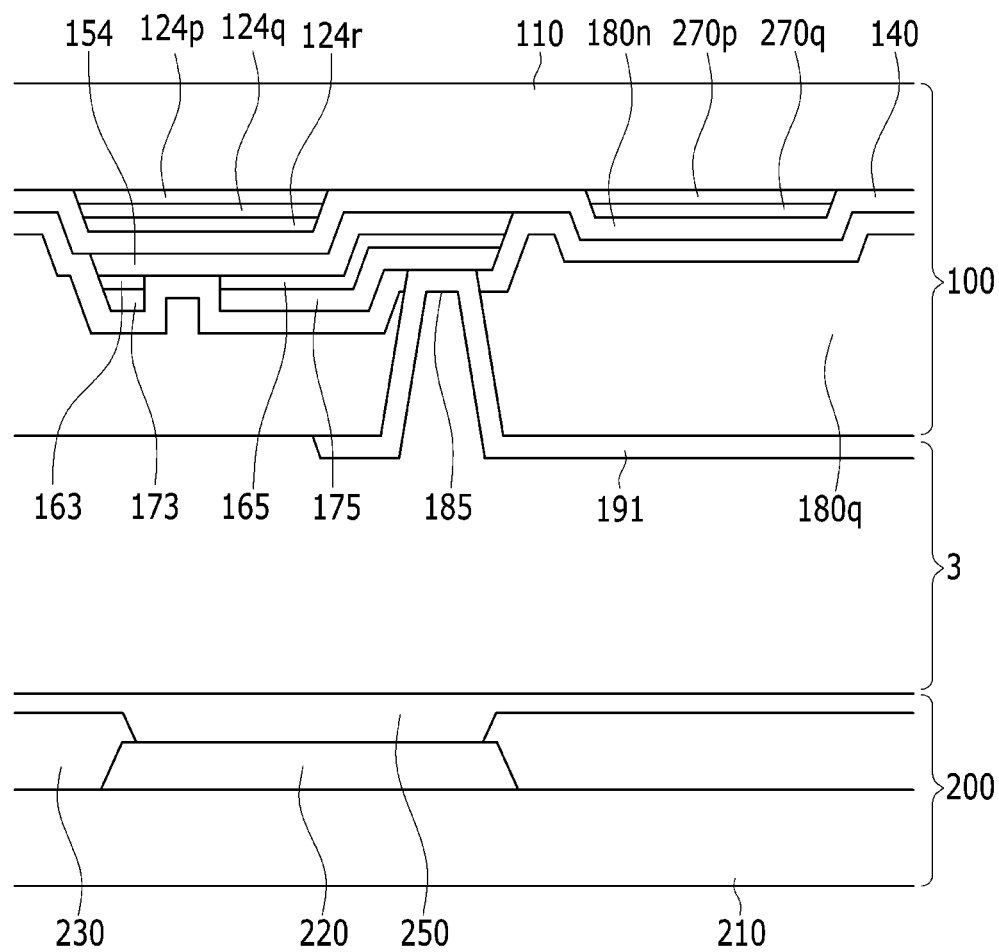
FIG. 13 is a cross-sectional view of an LCD including the TFT array panel shown in FIG. 12.

Next, an LCD according to another exemplary embodiment of the invention will be described with reference to FIG. 13. Referring to FIG. 13, an LCD according to the exemplary embodiment is similar to the LCD according to the exemplary embodiment shown in FIG. 3. That is, the LCD according to this exemplary embodiment of the invention includes the TFT array panel positioned at the upper side (e.g., the viewing side of the LCD) and the opposing panel positioned at the lower side (e.g., the rear side of the LCD). That is, in a conventional panel, a light source is positioned under the TFT array panel, but in contrast, in the LCD of the invention, the light source is positioned at the opposing panel and the surface that is actually recognized is the TFT array panel.

Firstly, the upper panel 100 will be described.

A plurality of gate lines 121 are disposed on an insulation substrate 110 including transparent glass or plastic.

The gate lines 121 transmit the gate signal and extend in the transverse direction. Each gate line 121 includes a plurality of gate electrodes 124 protruding from the gate line 121.

The gate line 121 and the gate electrode 124 have a triple-layered structure including lower layer 124$p$, middle layer 124$q$, and upper layer 124$r$. The lower layer 124$p$ may include titanium (Ti) or a titanium alloy, and the upper layer 124$r$ may include copper (Cu) or a copper alloy. The middle layer 124$q$ includes IZO.

The side surface of the gate lines 121 is inclined with respect to the substrate 110, and the angle of inclination between each side surface and the substrate may be in a range of about 30° to about 80° in a cross section.

The lower layer of the gate line may have a thickness of about 20 Å to about 200 Å in a cross section. Also, the middle layer of the gate line may have a thickness of about 400 Å to about 500 Å. The thickness of the upper layer of the gate line is not particularly limited. The thicknesses of the lower layer and the middle layer may be in a range such that light reflected from the lower layer including titanium generates destructive interference with the light reflected from the IZO middle layer, thereby minimizing reflection of the gate line.

Referring to FIG. 13, a plurality of common electrodes 270 are provided in and/or on the same plane surface as the gate line on the insulation substrate 110. The common electrode 270 has the plate-shape structure corresponding to the opening region (of the light blocking member) to displaying an image by one pixel. That is, the common electrode 270 has the continuous plate-shape structure at the opening region.

The common electrode 270 has a dual-layer structure including a lower layer 270$p$ and an upper layer 270$q$. The lower layer 270$p$ includes titanium (Ti) or a titanium alloy, and the upper layer 270$q$ includes IZO.

In an exemplary embodiment, the lower layer 270$p$ of the common electrode may have a thickness of about 20 Å to about 200 Å. In an exemplary embodiment, the upper layer 270$q$ of the common electrode may have a thickness of about 400 Å to about 500 Å.

The gate line and the common electrode are simultaneously deposited by the same process such that the thickness and the constituent material of the lower layer 124$p$ of the gate line and the lower layer 270$p$ of the common electrode may be the same, and the thickness and the constituent material of the middle layer 124$q$ of the gate line and the upper layer 270$q$ of the common electrode may be the same. The lower layer of the gate line and the lower layer 270$p$ of the common electrode may be in a same layer, and middle layer of the gate line and the upper layer 270$q$ of the common electrode may be in a same layer.

A gate insulating layer 140 including a silicon nitride (SiNx) or a silicon oxide (SiOx) is disposed on the gate line 121 and the common electrode 270. The gate insulating layer 140 may have a multilayered structure including at least two insulating layers having different physical properties from each other.

A semiconductor 154 including amorphous silicon or polysilicon is disposed on the gate insulating layer 140. In an exemplary embodiment, the semiconductor 154 may include the oxide semiconductor.

Ohmic contacts 163 and 165 are disposed on the semiconductor 154. The ohmic contacts 163 and 165 may include a material such as n+ hydrogenated amorphous silicon in which an n-type impurity such as phosphorus is doped at a high concentration, or a silicide. The ohmic contacts 163 and 165 may be disposed as a pair on the semiconductor 154. In the case where the semiconductor 154 is the oxide semiconductor, the ohmic contacts 163 and 165 may be omitted.

A side surface of each of the semiconductors 154 and the ohmic contacts 163 and 165 is inclined with respect to the surface of the substrate 110, and the inclination angle is in a range of about 30° to about 80° in a cross section.

A data conductor including a data line 171 including a source electrode 173 and a drain electrode 175 is positioned on the ohmic contacts 163 and 165 and the gate insulating layer 140.

The data line 171 includes a wide end portion (not illustrated) for connection with another layer or an external driving circuit. The data line 171 transmits a data signal, and is extended in a substantially vertical direction to intersect the gate line 121.

The source electrode 173 is a part of the data line 171 and is disposed on the same line as the data line 171. The drain electrode 175 is provided to be extended in parallel to the source electrode 173. Accordingly, the drain electrode 175 is parallel to a part of the data line 171.

The gate electrode 124, the source electrode 173, and the drain electrode 175 form a single TFT together with the semiconductor layer 154, and a channel of the TFT is disposed on the semiconductor layer 154 between the source electrode 173 and the drain electrode 175.

In an exemplary embodiment, the data line 171 and the drain electrode 175 may include a refractory metal such as molybdenum, chromium, tantalum, and titanium, or an alloy thereof, and may have a multilayer structure including a refractory metal layer (not illustrated) and a low resistance conductive layer (not illustrated). Examples of the multilayer structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer, for example. However, the data line 171 and the drain electrode 175 may include various other metals or conductors. A width of the data line 171 may be in a range of about 3.5 µm±0.75 µm.

In an exemplary embodiment, the sides of the data lines 171 and the sides of the drain electrodes 175 are also sloped to the surface of the substrate 110 at a slope angle within a range of about 30° to about 80°.

A first passivation layer 180$n$ is disposed on the data conductors 171, 173, and 175, the gate insulating layer 140, and the exposed portion of the semiconductor 154. The first passivation layer 180*n* may include the organic insulating material or the inorganic insulating material.

A second passivation layer 180*q* is disposed on the first passivation layer 180*n*. The second passivation layer 180*q* may be omitted. In an exemplary embodiment, the second passivation layer 180*q* may be a color filter. When the second passivation layer 180*q* is the color filter, the second passivation layer 180*q* may uniquely display one of primary colors, and an example of the primary colors is three primary colors, such as red, green, and blue, or yellow, cyan, and magenta. Although it is not illustrated, the color filter may further include a color filter displaying a combination color of the primary colors, or white, other than the primary colors.

A pixel electrode 191 is disposed on the second passivation layer 180*q*. The pixel electrode 191 includes a curved edge that is almost parallel to the first bent portion and the second bent portion of the data line 171. A plurality of second cutouts 92 is defined in the pixel electrode 191, and the pixel electrode 191 includes a plurality of second branch electrodes 192 defined by the plurality of second cutouts 92.

A first contact hole 185 exposing the drain electrode 175 is defined in the first passivation layer 180*n* and the second passivation layer 180*q*. The pixel electrode 191 is physically and electrically connected to the drain electrode 175 through the first contact hole 185, thereby receiving the voltage from the drain electrode 175.

Next, the lower panel 200 will be described.

A light blocking member 220 is disposed on an insulation substrate 210 including transparent glass or plastic. The light blocking member 220 is also referred to as a black matrix and prevents light leakage.

A plurality of color filters 230 is disposed on the substrate 210. When the second passivation layer 180*q* of the upper panel 100 is the color filter, the color filter 230 of the lower panel 200 may be omitted. In another exemplary embodiment, the light blocking member 220 of the lower panel 200 may be disposed in the upper panel 100.

An overcoat 250 is disposed on the color filter 230 and the light blocking member 220. The overcoat 250 may include an (organic) insulator, prevents the color filters 230 from being exposed, and provides a planarized surface. In another exemplary embodiment, the overcoat 250 may be omitted.

In an exemplary embodiment, an alignment layer may be disposed on the overcoat 250.

The liquid crystal layer 3 includes a nematic liquid crystal material having positive dielectric anisotropy. Liquid crystal molecules of the liquid crystal layer 3 are arranged so that a long axis direction thereof is parallel to the display panels 100 and 200, and the liquid crystal molecules have a twisted spiral structure where an angle thereof is 90° from the rubbing direction of the alignment layer of the upper panel 100 to the lower display panel 200.

The pixel electrode 191 receives the data voltage from the drain electrode 175, and the common electrode 270 receives the common voltage from a common voltage application unit disposed outside the display area.

The pixel electrode 191 and the common electrode 270, which are field generating electrodes, generate an electric field so that liquid crystal molecules of the liquid crystal layer 3 positioned on the two electrodes 191 and 270 rotate in a direction parallel to the direction of the electric field. Polarization of light which passes through the liquid crystal layer varies according to the rotation direction of the liquid crystal molecules determined as described above.

Next, a method manufacturing the TFT array panel shown in FIGS. 11 and 12 according to an exemplary embodiment of the invention will be described with reference to FIGS. 14 to 20.

Figure 14:
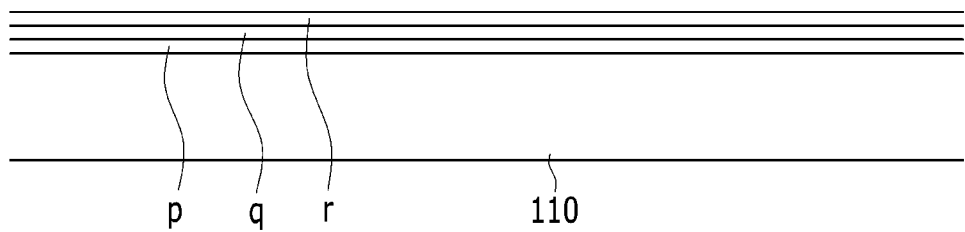
FIGS. 14 to 20 are views sequentially showing an exemplary embodiment of a manufacturing process of the TFT array panel shown in FIG. 12.

Firstly, as shown in FIG. 14, on an insulation substrate 110 including transparent glass or plastic, a lower layer (p) including titanium, a middle layer (q), including a transparent conductive material, and an upper layer (r) including copper are sequentially deposited by sputtering.

Figure 15:
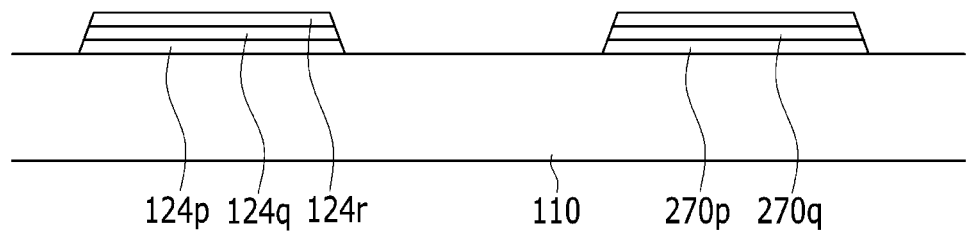
Figure 16:
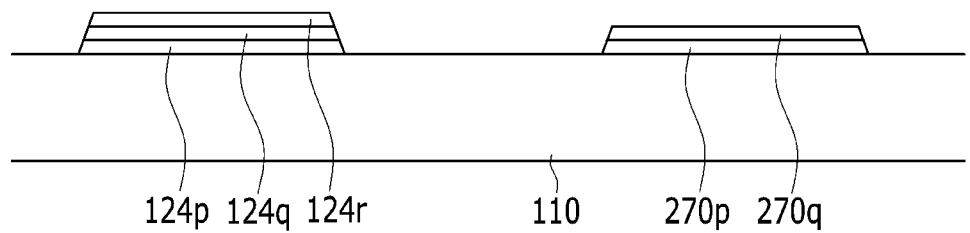

Next, the deposited metal layers are etched by using an etchant composition etching both copper and titanium. By the etching, as shown in FIG. 15, the arrangement of the gate electrode 124 and the common electrode 270 is provided. Next, as shown in FIG. 16, by using an etchant selectively etching copper on the common electrode, the copper on the common electrode is selectively etched.

Figure 17:
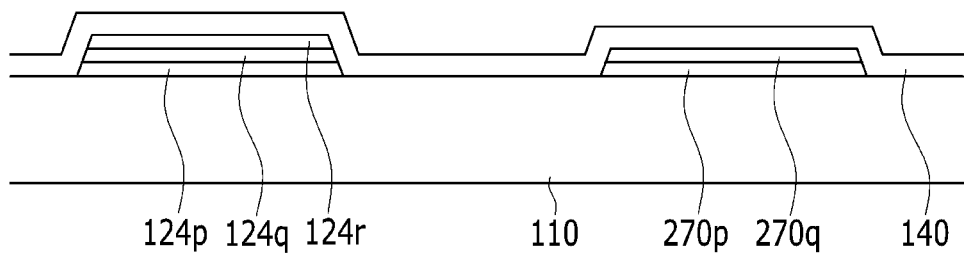
Figure 18:
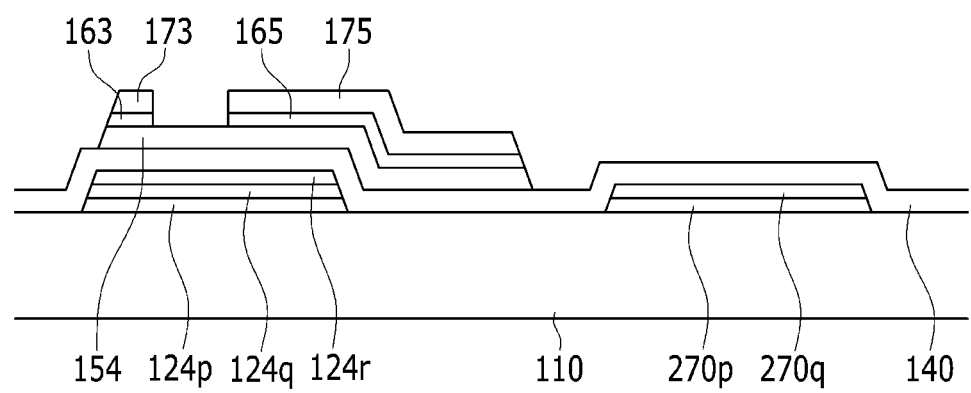

As shown in FIG. 17, a gate insulating layer 140 is then deposited on the gate electrode and the common electrode. Then, a semiconductor 154 and ohmic contacts 163 and 165 are deposited on the gate insulating layer by a chemical vapor deposition ("CVD"), and a data metal layer is deposited by the sputtering, for example. Next, as shown in FIG. 18, the data metal layer is patterned by using an etching mask to form a plurality of data lines including source electrodes 173 and drain electrodes 175.

Figure 19:
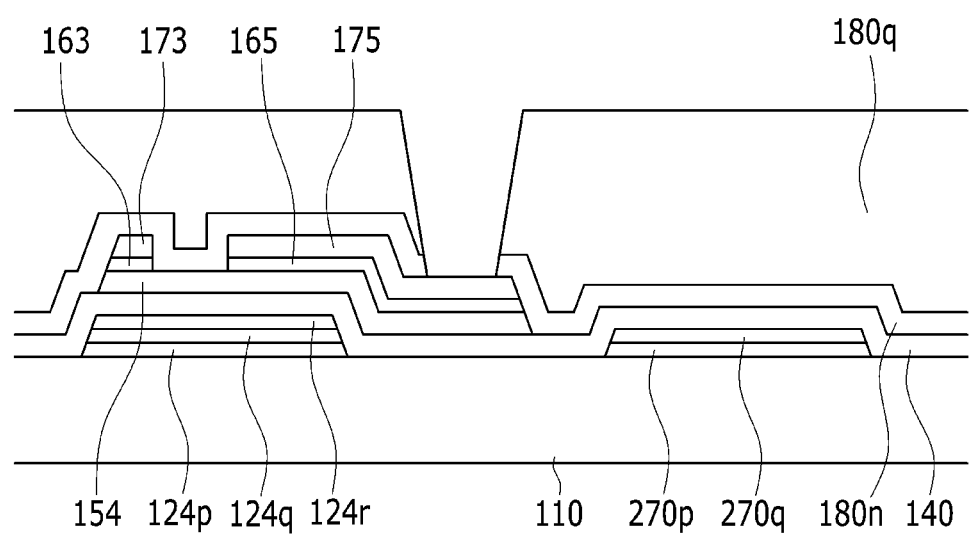

As shown in FIG. 19, a first passivation layer 180*n* and a second passivation layer 180*q* are deposited and patterned to define a contact hole 185 exposing the drain electrode.

Figure 20:
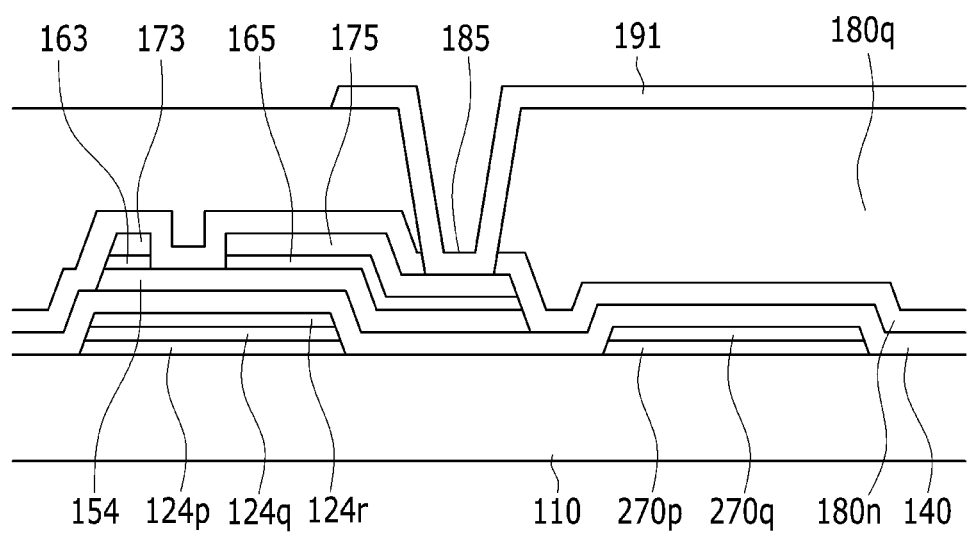

Next, as shown in FIG. 20, a pixel electrode 191 is disposed on the second passivation layer 180*q*. The pixel electrode is provided by depositing a transparent conductive layer such as ITO or IZO, coating a photosensitive film on the transparent conductive layer, and patterning the transparent conductive layer through photolithography.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A liquid crystal display comprising:
   a first substrate;
   a gate line which is disposed on the first substrate and includes:
   a lower layer including titanium;
   a middle layer including a transparent conductive material; and
   an upper layer including copper,
   a common electrode which is disposed on the first substrate and consists of a lower layer and an upper layer:
   the lower layer including titanium; and
   the upper layer including the transparent conductive material,
   a gate insulating layer disposed on the gate line and the common electrode;
   a semiconductor layer disposed on the gate insulating layer;
   a data line and a drain electrode disposed on the semiconductor layer;
   a passivation layer which covers the data line and the drain electrode, and a contact hole which is defined in the passivation layer and exposes a part of the drain electrode; and
   a pixel electrode electrically connected to the drain electrode through the contact hole, a second substrate facing the first substrate;
a color filter positioned on the second substrate; and
a light source positioned under the second substrate,
wherein the light source is disposed closer to the second substrate compared to the first substrate.

2. The thin film transistor array panel of claim 1, wherein the gate line and the common electrode are positioned in or directly on a same plane.

3. The thin film transistor array panel of claim 1, wherein the transparent conductive material of the gate line and the common electrode includes indium zinc oxide.

4. The thin film transistor array panel of claim 3, wherein a thickness of the lower layer of the gate line and the common electrode including titanium in a cross section is in a range of about 20 angstrom to about 200 angstrom.

5. The thin film transistor array panel of claim 4, wherein a thickness of the middle layer of the gate line and the upper layer of the common electrode including the indium zinc oxide in the cross section is in a range of about 400 angstrom to about 500 angstrom.

* * * * *